(12) United States Patent
Levy et al.

(10) Patent No.: US 8,867,870 B2
(45) Date of Patent: Oct. 21, 2014

(54) OPTICAL MODULE FABRICATED ON FOLDED PRINTED CIRCUIT BOARD

(75) Inventors: Shmuel Levy, Kiryat Tivon (IL); Shai Rephaeli, Kiryat Tivon (IL); Yonatan Malkiman, Kfar Yehezkel (IL)

(73) Assignee: Mellanox Technologies Ltd., Yokneam (IL)

( * ) Notice: Subject to any disclaimer, the term of this patent is extended or adjusted under 35 U.S.C. 154(b) by 184 days.

(21) Appl. No.: 13/366,326

(22) Filed: Feb. 5, 2012

(65) Prior Publication Data

US 2013/0202247 A1 Aug. 8, 2013

(51) Int. Cl.
*G02B 6/12* (2006.01)
*H05K 1/18* (2006.01)
*G02B 6/43* (2006.01)

(52) U.S. Cl.
CPC . *H05K 1/189* (2013.01); *G02B 6/43* (2013.01)
USPC .......... 385/14; 29/831; 29/832; 385/88

(58) Field of Classification Search
CPC .......... H05K 1/189; H01L 2224/48227; G02B 6/43
USPC .......... 385/18, 14, 88–94; 429/143, 147; 257/713–714; 29/831, 832
See application file for complete search history.

(56) References Cited

U.S. PATENT DOCUMENTS

| | | | |
|---|---|---|---|
| 4,130,343 A | 12/1978 | Miller et al. | |
| 4,337,759 A | 7/1982 | Popovich et al. | |
| 4,703,984 A * | 11/1987 | Mitchell, Jr. | 439/70 |
| 4,979,787 A * | 12/1990 | Lichtenberger | 385/88 |
| 5,073,003 A | 12/1991 | Clark | |
| 5,404,869 A | 4/1995 | Parkyn, Jr. et al. | |
| 5,571,754 A | 11/1996 | Bertin et al. | |
| 5,917,976 A | 6/1999 | Yamaguchi | |
| 6,132,107 A | 10/2000 | Morikawa | |
| 6,456,766 B1 * | 9/2002 | Shaw et al. | 385/47 |
| 6,491,447 B2 | 12/2002 | Aihara | |
| 6,567,574 B1 | 5/2003 | Ma et al. | |
| 6,635,866 B2 * | 10/2003 | Chan et al. | 250/239 |
| 6,697,399 B2 * | 2/2004 | Kimura et al. | 372/36 |
| 6,721,187 B2 | 4/2004 | Hall et al. | |
| 6,741,777 B2 * | 5/2004 | Jewell et al. | 385/49 |
| 6,817,782 B2 * | 11/2004 | Togami et al. | 385/92 |
| 6,841,739 B2 * | 1/2005 | Moore | 174/255 |
| 7,040,814 B2 | 5/2006 | Morimoto et al. | |

(Continued)

OTHER PUBLICATIONS

International Electrotechnical Commision, "Fiber Optic Connector Interfaces—Part 5: Type MT Connector Family", IEC document No. IEC61754-5, second edition, 32 pages, Jul. 2005.

(Continued)

*Primary Examiner* — Ellen Kim

(74) *Attorney, Agent, or Firm* — D. Kligler I.P. Services Ltd.

(57) ABSTRACT

An optical interface module includes a single flexible Printed Circuit Board (PCB) including conductive traces. An electrical connector, one or more opto-electronic transducers and ancillary circuitry are disposed on the flexible PCB. The electrical connector is configured to mate with a corresponding connector on a substrate. The opto-electronic transducers are configured to be coupled to optical fibers carrying optical signals. The ancillary circuitry is coupled by the traces to the opto-electronic transducers and the electrical connector so as to convey electrical signals corresponding to the optical signals between the opto-electronic transducers and the electrical connector.

37 Claims, 5 Drawing Sheets

(56) References Cited

U.S. PATENT DOCUMENTS

| | | | |
|---|---|---|---|
| 7,049,704 | B2 | 5/2006 | Chakravorty et al. |
| 7,091,062 | B2 | 8/2006 | Geyer |
| 7,265,719 | B1 * | 9/2007 | Moosbrugger et al. ....... 343/700 MS |
| 7,267,553 | B2 * | 9/2007 | Sone .............................. 439/67 |
| 7,289,701 | B2 | 10/2007 | Lam et al. |
| 7,350,985 | B2 | 4/2008 | Laughlin et al. |
| 7,420,262 | B2 | 9/2008 | Bauer et al. |
| 7,515,415 | B2 | 4/2009 | Monfarad et al. |
| 7,538,358 | B2 | 5/2009 | Badehi et al. |
| 7,665,911 | B2 | 2/2010 | Hamazaki |
| 7,887,243 | B2 | 2/2011 | Abel et al. |
| 8,043,877 | B2 | 10/2011 | Badehi et al. |
| 8,115,302 | B2 | 2/2012 | Andry et al. |
| 8,144,473 | B2 * | 3/2012 | Yumoto et al. ................ 361/749 |
| 8,272,788 | B2 | 9/2012 | Ohta |
| 8,315,287 | B1 | 11/2012 | Roggero et al. |
| 8,723,332 | B2 | 5/2014 | McElrea et al. |
| 2002/0149074 | A1 * | 10/2002 | Imaeda .......................... 257/432 |
| 2003/0198439 | A1 | 10/2003 | Hiramatsu |
| 2004/0124523 | A1 | 7/2004 | Poo et al. |
| 2004/0184727 | A1 | 9/2004 | Liu et al. |
| 2004/0207049 | A1 | 10/2004 | Bauer et al. |
| 2006/0008214 | A1 * | 1/2006 | Giboney et al. ................. 385/92 |
| 2008/0031629 | A1 * | 2/2008 | Nguyen et al. ................ 398/135 |
| 2008/0128864 | A1 | 6/2008 | Cho |
| 2009/0189258 | A1 | 7/2009 | Mariani et al. |
| 2012/0051685 | A1 | 3/2012 | Su et al. |
| 2012/0224814 | A1 * | 9/2012 | Hirano et al. ................... 385/49 |
| 2013/0136885 | A1 | 5/2013 | Fujii et al. |
| 2013/0156386 | A1 | 6/2013 | Miller |

OTHER PUBLICATIONS

Lagziel et al., U.S. Appl. No. 13/851,178, filed Mar. 27, 2012.
Levy et al., U.S. Appl. No. 13/677,374, filed Nov. 15, 2012.
Levy et al., U.S. Apple. No. 13/731,025, filed Dec. 30, 2012.
Stockham et al., "Assembly of micro-optical systems with mechanical positioning", Proceedings of the SPIE, Optomechatronic Micro/Nano Devices and Components II, 637609, Oct. 13, 2006.
U.S. Appl. No. 13/369,324, filed Feb. 9, 2012.
U.S. Appl. No. 13/419,447, filed Mar. 14, 2012.
U.S. Appl. No. 13/419,449, filed Mar. 14, 2012.
U.S. Appl. No. 13/481,874, filed May 28, 2012.
U.S. Appl. No. 13/532,829, filed Jun. 26, 2012.
Connected Fibers, LLC., "MT Ferrules", Datasheet, Jan. 2009.
Lee et al., "Silicon Optical Bench for Transmitter Module", Department of Optics and Photonics, National Central University, Taiwan, Oct. 19, 2009.
"Glass and Silicon Packages Webinar", Georgia Institute of Technology, 3D-Systems Packaging Research Center, Atlanta, USA, Jul. 21, 2010.
Micralyne, Inc., "MEMS Optical Components", Apr. 5, 2012.
Eldada et al., "Advances in Polymer Integrated Optics", IEEE Journal of Selected Topics in Quantum Electronics, vol. 5, No. 1, pp. 54-68, Jan./Feb. 2000.
U.S. Appl. No. 13/532,829 Office Action dated Oct. 4, 2013.
U.S. Appl. No. 13/369,324 Office Action dated Nov. 4, 2013.
U.S. Appl. No. 13/677,374 Office Action dated Jan. 30, 2014.
U.S. Appl. No. 13/731,025 Office Action dated Mar. 20, 2014.
U.S. Appl. No. 13/851,178 Office Action dated Aug. 29, 2014.

* cited by examiner

OPTICAL MODULE FABRICATED ON FOLDED PRINTED CIRCUIT BOARD

FIELD OF THE INVENTION

The present invention relates generally to optical communication devices, and particularly to optical interface modules.

BACKGROUND OF THE INVENTION

Optical interface modules are used in communication equipment for converting optical signals into electrical signals and vice versa. Some optical interface modules comprise components such as Photo-Detectors (PDs) and Trans-Impedance Amplifiers (TIAs) for optical reception, drivers and Vertical Cavity Surface-Emitting Lasers (VCSELs) for optical transmission, high-speed electrical connectors, as well as light coupling optics for coupling light to and from optical fibers that are connected to the optical interface module.

SUMMARY OF THE INVENTION

An embodiment of the present invention that is described herein provides an optical interface module. The module includes a single flexible Printed Circuit Board (PCB) including conductive traces. An electrical connector, one or more opto-electronic transducers and ancillary circuitry are all disposed on the flexible PCB. The electrical connector is configured to mate with a corresponding connector on a substrate. The opto-electronic transducers are configured to be coupled to optical fibers carrying optical signals. The ancillary circuitry is coupled by the traces to the opto-electronic transducers and the electrical connector so as to convey electrical signals corresponding to the optical signals between the opto-electronic transducers and the electrical connector.

In some embodiments, the flexible PCB is folded to form at least first and second faces disposed obliquely with respect to one another, the conductive traces are disposed on both the first and second faces, the electrical connector is disposed on the first face and the opto-electronic transducers are disposed on the second face. In a disclosed embodiment, the second face is perpendicular to the first face. In an embodiment, the flexible PCB is further folded to form a third face that is parallel with the first face, and the electrical connector includes multiple connector pads that are disposed on the first and third faces.

In another embodiment, the flexible PCB is folded at a right angle adjacently to the electrical connector, and is configured to plug into a right-angle socket on the substrate. In yet another embodiment, the electrical connector includes multiple compressible conductive bumps that are configured to make contact with corresponding conductive pads on the substrate. In still another embodiment, the opto-electronic transducers include one or more photo-detectors, and the ancillary circuitry includes one or more amplifiers for amplifying one or more of the electrical signals produced by the photo-detectors. Additionally or alternatively, the opto-electronic transducers include one or more photo-emitters, and the ancillary circuitry includes one or more drivers for driving the photo-emitters with one or more of the electrical signals.

In some embodiments, the ancillary circuitry includes one or more integrated circuits that are configured to control the ancillary circuitry. In an embodiment, the flexible PCB has one or more openings facing the opto-electronic transducers, for passing the optical signals to the opto-electronic transducers. In some embodiments, the electrical connector includes connector terminals that are configured to connect to respective mating terminals in the corresponding connector on the substrate, such that the mating terminals make electrical contact with respective distal ends of the connector terminals.

There is additionally provided, in accordance with an embodiment of the present invention, a cable assembly including multiple optical fibers for carrying optical signals, and an optical interface module. The optical interface module includes a single flexible Printed Circuit Board (PCB) including conductive traces. An electrical connector is disposed on the flexible PCB and is configured to mate with a corresponding connector on a substrate. One or more opto-electronic transducers are disposed on the flexible PCB and are coupled to the optical fibers. Ancillary circuitry is disposed on flexible PCB and is coupled by the traces to the opto-electronic transducers and the electrical connector so as to convey electrical signals corresponding to the optical signals between the opto-electronic transducers and the electrical connector.

There is also provided, in accordance with an embodiment of the present invention, a method for producing an optical interface module. The method includes providing a single flexible Printed Circuit Board (PCB) including conductive traces. An electrical connector is disposed on the flexible PCB for mating with a corresponding connector on a substrate. One or more opto-electronic transducers are disposed on the flexible PCB for coupling to optical fibers carrying optical signals. Ancillary circuitry is disposed on the flexible PCB for conveying electrical signals corresponding to the optical signals between the opto-electronic transducers and the electrical connector over the traces.

The present invention will be more fully understood from the following detailed description of the embodiments thereof, taken together with the drawings in which:

DETAILED DESCRIPTION OF EMBODIMENTS

Overview

Embodiments of the present invention that are described hereinbelow provide improved optical interface module configurations. The disclosed modules exchange signals between optical fibers at one end and electronic equipment at the other end. Modules of this sort can be used, for example, for mounting on a main Printed Circuit Board (PCB) of the communication equipment.

In some embodiments, an optical interface module comprises one or more opto-electronic transducers, for example Photo-Detectors (PDs) for converting optical signals into electrical signals, and/or Vertical Cavity Surface-Emitting Lasers (VCSELs) for converting electrical signals into optical signals in the opposite direction. The electrical signals are conveyed to and from the transducers via ancillary circuitry, for example Trans-Impedance Amplifiers (TIAs) that amplify the outputs of the PDs, and drivers that produce inputs for the VCSELs. An electrical connector transfers the electrical signals between the module and a corresponding connector on a circuit substrate (e.g., using differential or single-ended transmission lines).

In the disclosed embodiments, the entire circuitry described above, including the transducers, ancillary circuitry and electrical connector, is disposed on a single flexible Printed Circuit Board (PCB). When folded into its final shape in the module, the flexible PCB forms at least two faces in oblique (i.e., non-parallel) planes, such that the opto-electronic transducers are located on one face and the electrical connector is located on another face. The flexible PCB comprises conductive circuit traces, which run via both faces and connect the opto-electronic transducers via the ancillary circuitry to the electrical connector.

The use of a single flexible PCB eliminates the need for additional connectors or other interconnections in the electrical signal paths, and simplifies the assembly process of the module. The resulting optical interface modules can therefore have high reliability, small size, low cost, and a high degree of signal integrity. Since the opto-electronic transducers and the electrical connector are located on different, oblique faces of the flexible PCB, the disclosed optical modules can fit in a small form factor while avoiding light-bending optics. These features make the optical interface modules described herein particularly suitable for small-space and high-speed applications. Several examples of such optical interface modules are described in detail below.

Optical Interface Module on a Single Flex PCB

Figure 1:
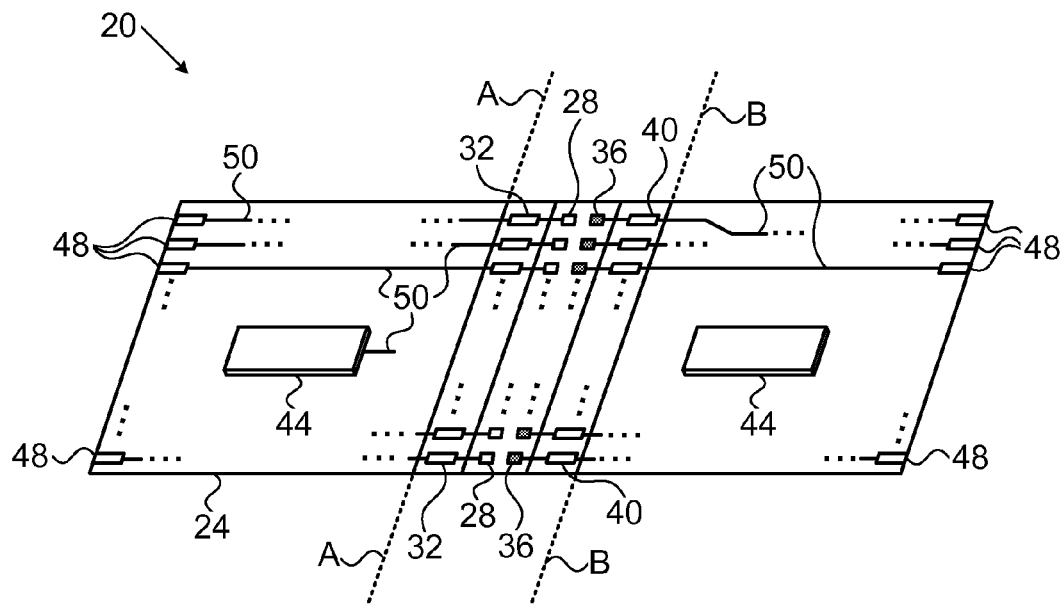
FIGS. 1 and 2 are schematic, pictorial illustrations of an optical interface module, in accordance with an embodiment of the present invention.
Figure 2:
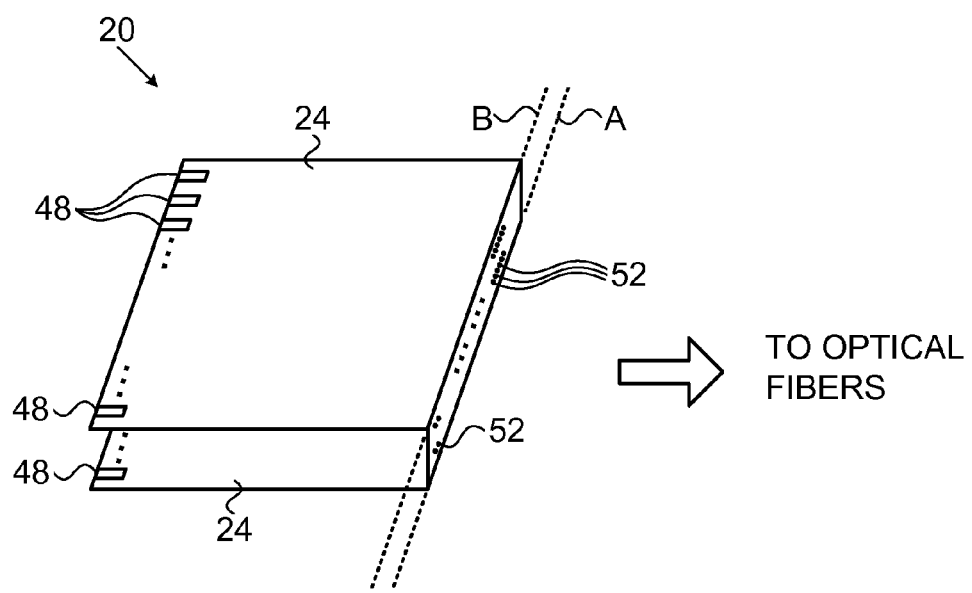

FIGS. 1 and 2 are schematic, pictorial illustrations of an optical interface module 20, in accordance with an embodiment of the present invention. Module 20 is fabricated on a single flexible Printed Circuit Board (PCB) 24. FIG. 1 shows module 20 in a flattened shape, before PCB 24 is folded into its final shape, for ease of explanation. FIG. 2 shows module 20 when the flexible PCB is folded into shape. Some elements of the module, such as external housing and other mechanical elements, are omitted from the figures for the sake of clarity.

Referring to FIG. 1, module 20 comprises multiple opto-electronic transducers, in the present example a row of Photo-Detectors (PDs) 28 and a row of Vertical Cavity Surface-Emitting Lasers (VCSELs) 36 or other photo-emitters. In the example of FIG. 1 the multiple PDs and VCSELs are shown as separate units, each disposed individually on PCB 24. In alternative embodiments, multiple PDs and/or multiple VCSELs may be integrated in a single device that is in turn disposed on flexible PCB 24.

The PDs receive optical signals from respective optical fibers (not shown in FIG. 1) that are coupled to module 20, and convert the optical signals into corresponding electrical signals. The VCSELs convert electrical signals for transmission into corresponding optical signals, and transmit the optical signals into the optical fibers.

Multiple Trans-Impedance Amplifiers (TIAs) 32 amplify the electrical signals that are produced by PDs 28. Multiple drivers 40 drive the VCSELs with the electrical signals for transmission. In the example of FIG. 1 the multiple TIAs and drivers are shown as separate units that are disposed individually on PCB 24. Alternatively, multiple TIAs 32 and/or multiple drivers 40 may be integrated in a single device that is disposed on flexible PCB 24.

In some embodiments, module 20 also comprises one or more Integrated Circuits (ICs) 44 that control and configure the TIAs and drivers, and possibly control other components such as status Light Emitting Diodes (LEDs). The TIAs, drivers and ICs are referred to herein collectively as ancillary circuitry that conveys electrical signals to and from the opto-electronic transducers.

Multiple connector terminals 48, typically gold-plated, are disposed along two edges of PCB 24. In the present example, connector terminals 48 comprise conductive pads that are printed on the surface of PCB 24, possibly on both opposite surfaces of the PCB. When the PCB is folded into shape (as shown in FIG. 2 below) terminals 48 form two rows of terminals that function as an electrical connector. This connector plugs into a mating connector, e.g., on a main PCB or other substrate of a host system such as network switch.

In some embodiments, connector terminals 48 are arranged in transmission-line geometry, and are connected using either differential or single-ended transmission lines to TIAs 32 and drivers 40. Terminals 48 are typically designed to maintain a minimal stub when connected to the mating connector.

The electrical connector is used for transferring high-speed electrical signals between module 20 and the host system. The signals may comprise, for example, electrical signals to be converted to optical signals by the VCSELs, electrical signals produced by the PDs, and/or control signals and power supply lines.

Flexible PCB 24 comprises conductive circuit traces 50 that connect the various components of module 20. The circuit traces connect the PDs and VCSELs via the ancillary circuitry to the electrical connector. Typically, the various module components (e.g., the transducers, ancillary circuitry and electrical connector) are soldered to conductive pads on PCB 24, and the pads are connected by traces 50.

Two axes denoted A and B are shown in FIG. 1. These axes indicate how flexible PCB 24 is folded into its final shape. The same two axes are shown in FIG. 2 below for ease of orientation. The term "single flexible PCB" refers to any type of PCB that is capable of bending or otherwise forming two of more faces in more than a single plane. In some embodiments, the flexible PCB may be flexible only in specific areas, e.g., in the vicinity of axes A and B. The flexible PCB may be fabricated from any suitable material and using any suitable manufacturing process. (FIG. 8 further below shows a flexible PCB configuration that may fold along a single axis.)

FIG. 2 shows module 20 when flexible PCB 24 is folded along axes A and B. In its final shape, PCB 24 is U-shaped and has three faces. Two parallel faces of the PCB comprise TIAs 32, drivers 40, ICs 44 and connector terminals 48. The third face of PCB 24 comprises two rows of openings 52. PDs 28 and VCSELs 36 are disposed behind openings 52 on the inner side of this face, such that each PD and VCSEL is aligned with a respective opening. (The PDs and VCSELs are located in the interior of the U-shaped PCB and are thus hidden from view in FIG. 2.)

In the present example, TIAs 32 and drivers 40 are disposed on the same face of PCB 24 as PDs 28 and VCSELs 36. In alternative embodiments, the TIAs and/or drivers may be disposed on any other desired face of the flexible PCB. An array of optical fibers can be coupled to the face of PCB 24 holding the PDs and VCSELs, such that the ends of the fibers are coupled to the PDs and VCSELs via openings 52. An example fixture for connecting a fiber array to module 20 is shown in FIG. 3 below.

The configuration of module 20 shown in FIGS. 1 and 2 is an example configuration, which is chosen purely for the sake of conceptual clarity. In alternative embodiments, any other suitable module configuration can be used. In one example embodiment, PCB 24 comprises two conductive layers and a single dielectric layer, reaching a total thickness on the order of 0.1 mm, e.g., 70 microns. The PCB may comprise any suitable material. Module 20 in this example comprises twelve PDs and respective TIAs, and twelve VCSELs and respective drivers. ICs 44 in this example are used for control and configuration as well as LED control. Alternatively, however, module 20 may comprise any other suitable numbers and types of opto-electronic transducers and/or any other suitable type of ancillary circuitry, and may have any suitable dimensions.

Figure 3A:
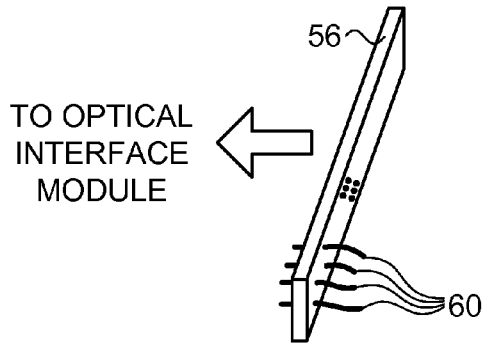
FIGS. 3A and 3B are schematic, pictorial illustrations of fixtures for coupling optical fibers to an optical interface module, in accordance with embodiments of the present invention.

FIG. 3A is a schematic, pictorial illustration of a fixture for coupling optical fibers to optical interface module 20, in accordance with an embodiment of the present invention. The fixture comprises a ferrule 56, which may be made-up of plastic or any other suitable material. Two rows of optical fibers 60 are inserted through ferrule 56. The positions of fibers 60 on the surface of ferrule 56 matches the positions of PDs 28 and VCSELs 36 in optical interface module 20 of FIGS. 1 and 2. Thus, when ferrule 56 is coupled and fixed to module 20, the edges of fibers 60 are positioned in front of the respective PDs and VCSELs.

In the present example, the ends of fibers 60 are not flush with the surface of ferrule 56, but rather extend beyond the ferrule surface by approximately half the thickness of PCB 24. When ferrule 56 is coupled to module 20, the ends of fibers 60 pass through openings 52 (FIG. 2) and are positioned with high accuracy in front of the PDs and VCSELs.

Figure 3B:
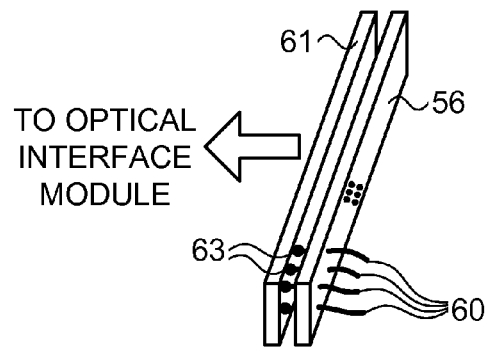

FIG. 3B is a schematic, pictorial illustration of another fixture for coupling optical fibers to optical interface module 20, in accordance with an alternative embodiment of the present invention. In this embodiment, the fixture comprises an additional lens array 61, which comprises multiple lenses 63 for directing light between fibers 60 and the opto-electronic transducers. Each lens 63 is positioned between the end of a respective fiber 60 and a respective PD 28 or VCSEL 36. In the embodiment of FIG. 3B, the ends of fibers 60 are typically flush with (i.e., do not extend beyond) the surface of ferrule 56.

In alternative embodiments, module 20 may be connected to an array of optical fibers in any other suitable way and using any other suitable mechanism.

Alternative Embodiments and Variations

Figure 4:
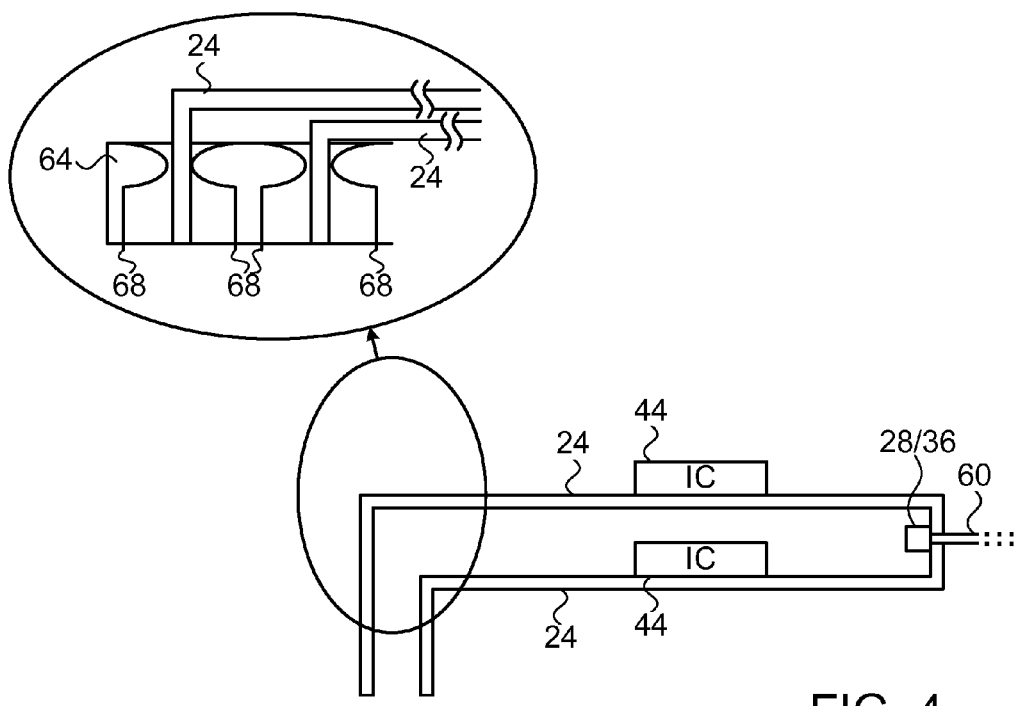
FIGS. 4 and 5 are side views of optical interface modules, in accordance with alternative embodiments of the present invention.

FIG. 4 is a side view of an optical interface module, in accordance with an alternative embodiment of the present invention. In the example of FIG. 4, the edges of PCB 24 holding the connector terminals are folded at a right angle. This configuration enables plugging the optical interface module into a straight socket 64 on the PCB of the host system. The configuration of FIG. 1 above, by contrast, may require a right-angle socket on the host system PCB. In the present example, socket 64 comprises four rows of spring terminals 68, which connect to the respective connector terminals on the edges of PCB 24.

Figure 9:
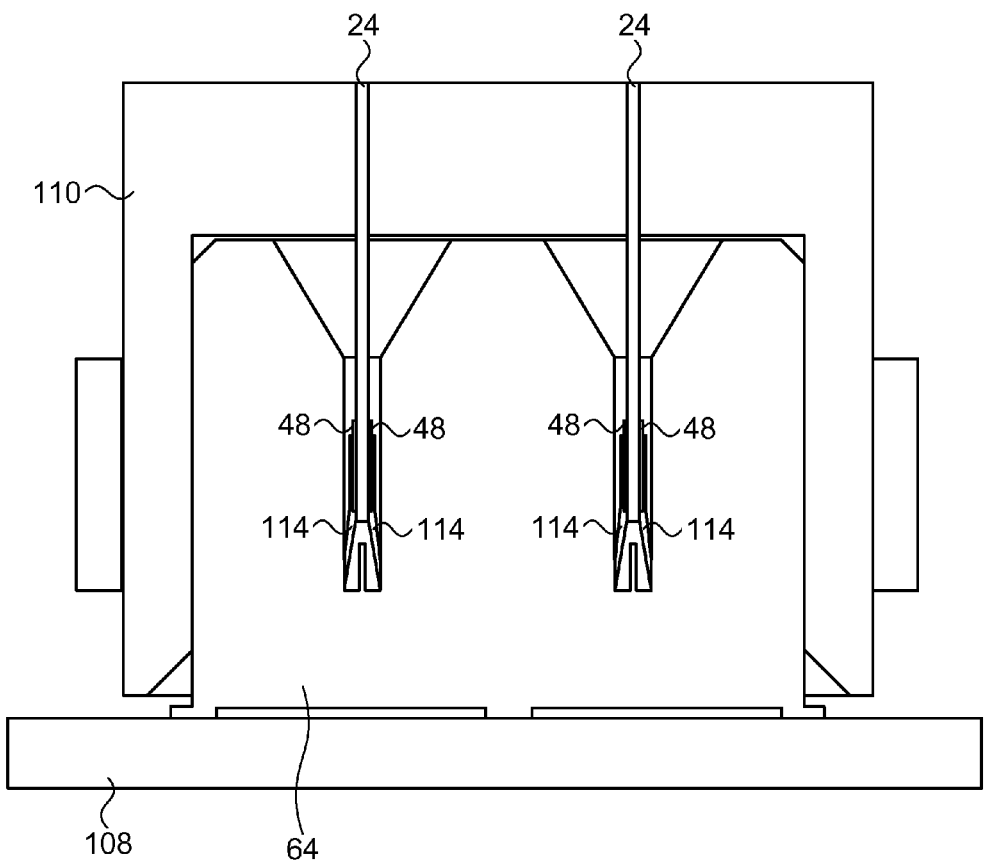
FIG. 9 is a side view of an optical interface module, in accordance with an embodiment of the present invention.

As can be seen in FIG. 4, each spring terminal 68 of socket 64 makes contact with a connector terminal on PCB 24 at a single contact point. The connector terminal on PCB 24, however, extends beyond the contact point and reaches the bottom of the socket. The section of the connector terminal that extends beyond the contact point has a non-terminated end (stub), and therefore may transmit electromagnetic radiation and/or degrade the electrical matching at the connector. This effect may cause signal distortion, particularly at high signal clock rates. In some embodiments, socket 64 is formed so as to ground the full length of the connector terminals of PCB 24, or otherwise prevent undesired radiation from non-terminated connector terminals. An example implementation of this sort is shown in FIG. 9 below.

Figure 5:
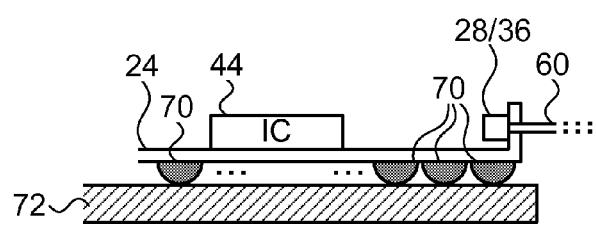

FIG. 5 is a side view of another optical interface module, in accordance with yet another embodiment of the present invention. In this embodiment, flexible PCB 24 is L-shaped so as to form two perpendicular faces. One face holds PDs 28 and VCSELs 36, and the other face holds an electrical connector for connecting to a substrate, e.g., a main PCB 72 of the host system.

In the present example, the electrical connector is implemented using an array of conductive bumps 70 that transfer electrical signals between PCBs 24 and 72. This sort of interconnection is typically suitable for fixed, one-time connection. When the optical interface module is fixed to PCB 72, bumps 70 are compressed so as to form solid electrical contact. This compression is typically irreversible, and therefore suitable for one-time connection. In alternative embodiments, any other suitable type of interconnection or electrical connector can be used.

Figure 6:
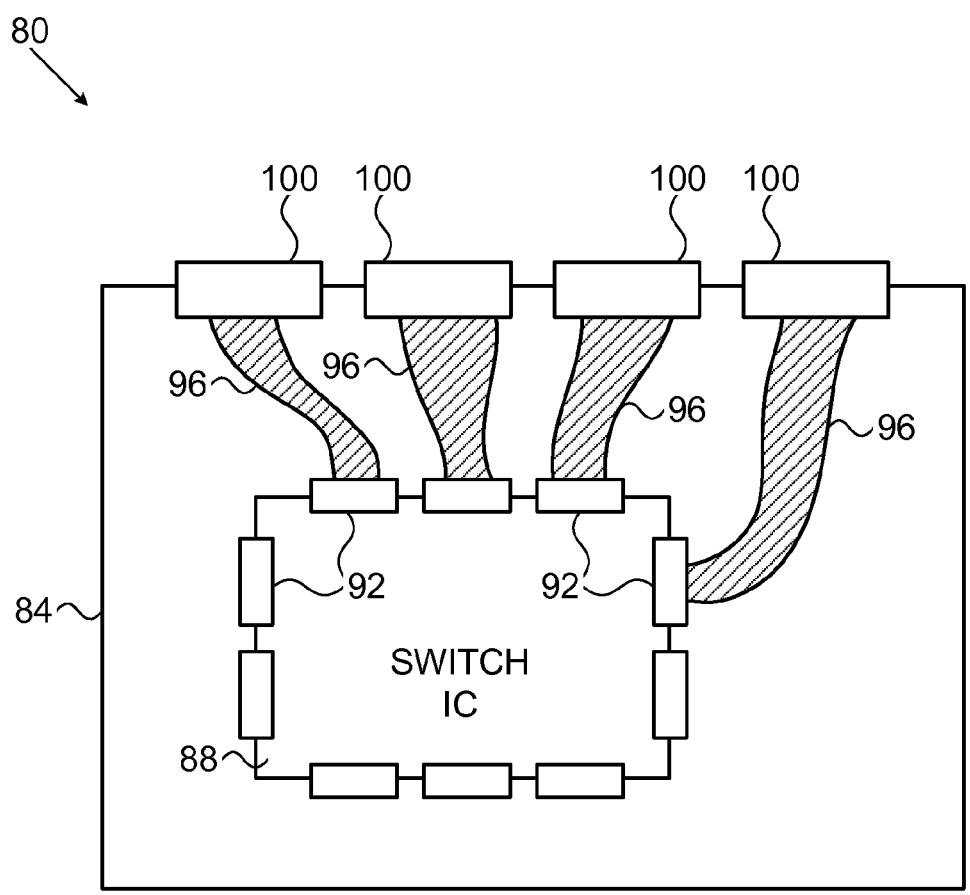
FIG. 6 is a top view of a network switch, in accordance with an embodiment of the present invention.

FIG. 6 is a top view of a network switch 80, in accordance with an embodiment of the present invention. Switch 80 may comprise, for example, an Ethernet switch, an Infiniband switch or any other suitable type of switch. Other types of network elements may also be implemented in a similar manner.

Switch 80 comprises a main PCB 88 that is packaged in a mechanical enclosure 84. Optical cable assemblies 96 connect the main PCB to optical connectors 100 on the panel of enclosure 84. Each optical cable assembly 96 comprises an array of optical fibers. On the side of the main PCB, each optical cable assembly 96 is terminated with an optical interface module 92. Module 92 is implemented using a flexible PCB in accordance with the disclosed techniques, e.g., using any of the configurations of FIGS. 1, 2, 4 and 5. By using the disclosed optical interfaces, switch 80 may have a small form factor.

Figure 7:
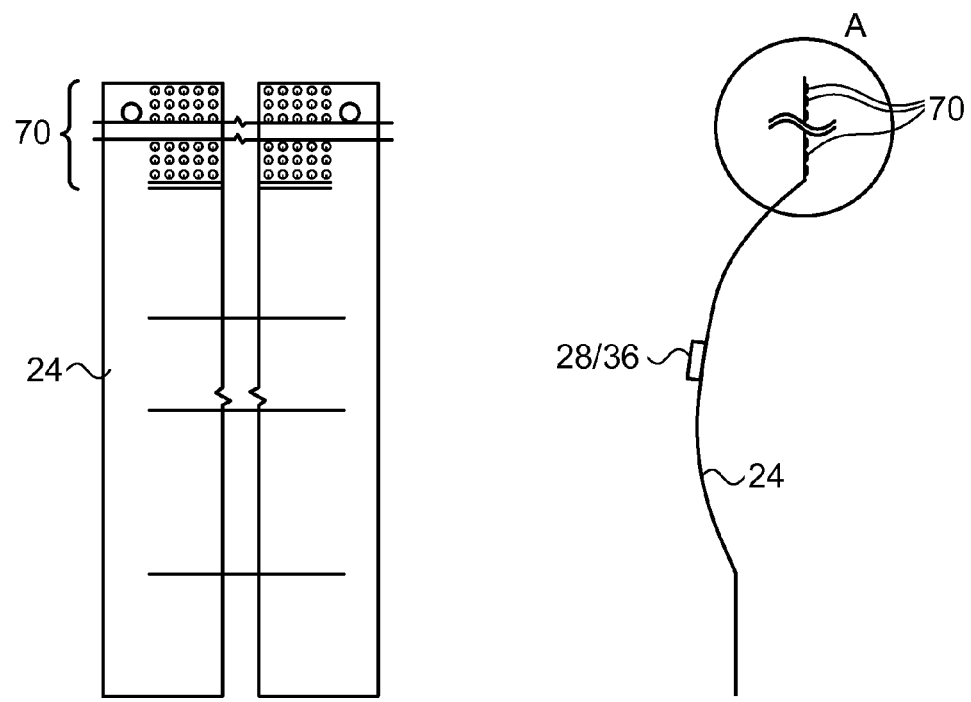
FIG. 7 is a diagram showing top and side views of an optical interface module, in accordance with an embodiment of the present invention.

FIG. 7 is a diagram showing top and side views of an optical interface module, in accordance with another embodiment of the present invention. In this example, the electrical connector (in a region marked "A") is implemented using an array of compressible bumps 70, similarly to the configuration of FIG. 5 above. The left-hand-side of the figure shows a top view of the module, and the right-hand-side of the figure shows a side view of the module.

Figure 8:
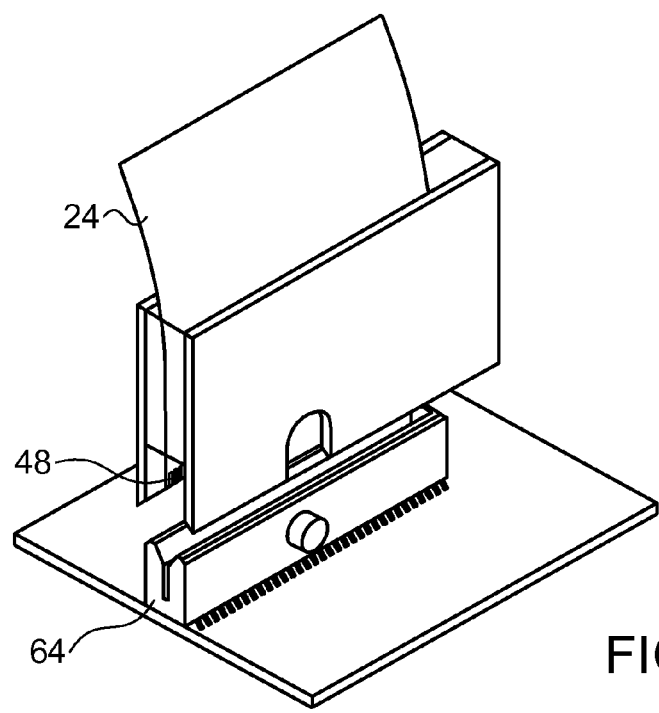
FIG. 8 is a three-dimensional view of an optical interface module, in accordance with an embodiment of the present invention.

FIG. 8 is a three-dimensional view of an optical interface module, in accordance with yet another embodiment of the present invention. In this example, the electrical connector is implemented using connector terminals 48, similarly to the configuration of FIGS. 1, 2 and 4 above. The figure shows the end of flexible PCB 24 holding the electrical connector. The opposite side of the flexible PCB, which holds the opto-electronic transducers, is not shown. In some embodiments, although not necessarily, flexible PCB 24 in this example may be folded along a certain axis, such that the electrical connector is in one plane and the opto-electronic transducers are in another plane.

The example of FIG. 8 shows an electrical connector (terminals 48) on a single edge of flexible PCB 24. In alternative embodiments (e.g., in the configuration of FIG. 2 above) the PCB is folded such that two rows of terminals 48 are formed on two edges of PCB 24. In such embodiments, an interconnection scheme similar to that of FIG. 8 can be implemented, with two parallel faces of PCB 24 plugged into socket 64.

FIG. 9 is a side view of an optical interface module, in accordance with an embodiment of the present invention. In the example module of FIG. 9, socket 64 is mounted on a substrate 108, for example a main PCB of a host system. PCB 24 is folded such that two parallel faces of the PCB are fitted in a connector 110 and plugged into socket 64.

In the present example, socket 64 comprises four rows of spring contacts 114. When connector 110 is plugged into socket 64, terminals 48 on the edges of PCB 24 make electrical contact with spring contacts 114. Note that in this implementation, PCB 24 makes electrical contact with spring contacts 114 up to its edge. Therefore, there are no unterminated stubs at the ends of terminals 48. This implementation prevents radiation from the connector and other forms of distortion caused by unterminated stubs.

Although the embodiments described herein mainly address optical interface modules for network elements such as switches, the methods and systems described herein can also be used in other applications, such as in PCIe bus interfaces that connect computer microprocessors to memory modules.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An optical interface module, comprising:
a single flexible Printed Circuit Board (PCB) comprising conductive traces and folded to include at least three faces, in different planes;
multiple electrical connector pads, which are disposed on first and third faces of the flexible PCB and are configured to mate with a corresponding connector on a substrate;
one or more opto-electronic transducers, which are disposed on a second one of the faces of the flexible PCB between the first and third faces, and are configured to be coupled to optical fibers carrying optical signals; and
ancillary circuitry, which is disposed on the flexible PCB and is coupled by the traces to the opto-electronic transducers and the electrical connector so as to convey electrical signals corresponding to the optical signals between the opto-electronic transducers and the electrical connector.

2. The module according to claim 1, wherein the second face is perpendicular to the first face.

3. The module according to claim 2, wherein the flexible PCB is further folded so the third face is parallel with the first face.

4. The module according to claim 1, wherein the flexible PCB is folded at a right angle adjacently to the electrical connector, and is configured to plug into a right-angle socket on the substrate.

5. The module according to claim 1, wherein the opto-electronic transducers comprise one or more photo-detectors, and wherein the ancillary circuitry comprises one or more amplifiers for amplifying one or more of the electrical signals produced by the photo-detectors.

6. The module according to claim 1, wherein the opto-electronic transducers comprise one or more photo-emitters, and wherein the ancillary circuitry comprises one or more drivers for driving the photo-emitters with one or more of the electrical signals.

7. The module according to claim 1, wherein the ancillary circuitry comprises one or more integrated circuits that are configured to control the ancillary circuitry.

8. The module according to claim 1, wherein the flexible PCB has one or more openings facing the opto-electronic transducers, for passing the optical signals to the opto-electronic transducers.

9. The module according to claim 1, wherein the electrical connector pads comprise connector terminals that are configured to connect to respective mating terminals in the corresponding connector on the substrate, such that the mating terminals make electrical contact with respective distal ends of the connector terminals.

10. A cable assembly, comprising:
multiple optical fibers for carrying optical signals; and
an optical interface module, comprising:
a single flexible Printed Circuit Board (PCB) comprising conductive traces and folded to include at least three faces, in different planes;
multiple electrical connector pads, which are disposed on first and third faces of the flexible PCB and are configured to mate with a corresponding connector on a substrate;
one or more opto-electronic transducers, which are disposed on a second one of the faces of the flexible PCB between the first and third faces, and are coupled to the optical fibers; and
ancillary circuitry, which is disposed on the flexible PCB and is coupled by the traces to the opto-electronic transducers and the electrical connector so as to convey electrical signals corresponding to the optical signals between the opto-electronic transducers and the electrical connector.

11. The cable assembly according to claim 10, and comprising a ferrule, which has the optical fibers inserted therethrough and is coupled to fix the optical fibers to the opto-electronic transducers.

12. The cable assembly according to claim 10, and comprising an array of lenses that are coupled between the opto-electronic transducers and respective optical fibers.

13. A method for producing an optical interface module, the method comprising:
providing a single flexible Printed Circuit Board (PCB) comprising conductive traces;
disposing on the flexible PCB multiple electrical connector pads for mating with a corresponding connector on a substrate;

disposing on the flexible PCB one or more opto-electronic transducers for coupling to optical fibers carrying optical signals;

disposing on the flexible PCB ancillary circuitry for conveying electrical signals corresponding to the optical signals between the opto-electronic transducers and the electrical connector over the traces; and folding the flexible PCB to include at least three faces, in different planes, such that the multiple electrical connector pads are disposed on first and third faces of the PCB and are configured to mate with a corresponding connector on said substrate, and the one or more electronic transducers are disposed on a second one of the faces between the first and third faces.

14. The method according to claim 13, wherein folding the flexible PCB comprises setting the second face to be perpendicular to the first face.

15. The method according to claim 13, wherein folding the flexible PCB comprises folding such that the third face of the flexible PCB is parallel with the first face.

16. The method according to claim 13, and comprising folding the PCB at a right angle adjacently to the electrical connector, so as to plug the electrical connector into a right-angle socket on the substrate.

17. The method according to claim 13, wherein disposing the opto-electronic transducers comprises disposing one or more photo-detectors, and wherein disposing the ancillary circuitry comprises disposing one or more amplifiers for amplifying one or more of the electrical signals produced by the photo-detectors.

18. The method according to claim 13, wherein disposing the opto-electronic transducers comprises disposing one or more photo-emitters, and wherein disposing the ancillary circuitry comprises disposing one or more drivers for driving the photo-emitters with one or more of the electrical signals.

19. The method according to claim 13, wherein disposing the ancillary circuitry comprises disposing one or more integrated circuits for controlling the ancillary circuitry.

20. The method according to claim 13, wherein providing the flexible PCB comprises forming in the flexible PCB one or more openings facing the opto-electronic transducers, for passing the optical signals to the opto-electronic transducers.

21. The method according to claim 13, wherein the electrical connector pads comprise connector terminals that are configured to connect to respective mating terminals in the corresponding connector on the substrate, such that the mating terminals make electrical contact with respective distal ends of the connector terminals.

22. The module according to claim 1, wherein the flexible PCB defines a U shape and the one or more opto-electronic transducers are located in the interior of the U-shape.

23. The module according to claim 1, wherein the flexible PCB comprises a PCB having both flexible and rigid areas.

24. The module according to claim 1, wherein the flexible Printed Circuit Board in the area of the electrical connector is configured to be plugged into a corresponding socket on the substrate.

25. The cable assembly according to claim 10, wherein the single flexible PCB defines one or more openings and wherein the one or more opto-electronic transducers are coupled to the optical fibers through the one or more openings.

26. The cable assembly according to claim 10, wherein ends of the fibers enter the one or more openings in the single flexible PCB, in a manner coupling the fibers to the one or more opto-electronic transducers.

27. The module according to claim 1, wherein the electrical connector pads are printed on both opposite surfaces of the flexible PCB.

28. The module according to claim 1, wherein PCB is U-shaped and the one or more opto-electronic transducers are configured to be coupled to optical fibers on an outer side of the second face of the U-shaped PCB.

29. The module according to claim 1, wherein the one or more opto-electronic transducers are disposed on an inner side of the PCB.

30. The module according to claim 1, wherein the ancillary circuitry includes amplifiers or drivers disposed on the first or third faces.

31. The module according to claim 1, wherein the electrical connector pads comprise connector terminals that are configured to connect to respective spring terminals in the corresponding connector on the substrate.

32. The module according to claim 1, wherein the electrical connector pads are configured to plug into the corresponding connector on the substrate.

33. The module according to claim 1, wherein the one or more opto-electronic transducers are configured to be coupled to the optical fibers through openings in the PCB.

34. The cable assembly according to claim 10, wherein the one or more opto-electronic transducers are configured to be coupled to the optical fibers through openings in the PCB.

35. The method according to claim 13, wherein the one or more opto-electronic transducers are coupled to optical fibers on an outer side of the second face of the U-shaped PCB.

36. The method according to claim 13, wherein the one or more opto-electronic transducers are coupled to the optical fibers through openings in the PCB.

37. The method according to claim 13, wherein the one or more opto-electronic transducers are disposed on an inner side of the PCB.

* * * * *